(12) United States Patent
Blair et al.

(10) Patent No.: US 8,994,229 B2
(45) Date of Patent: Mar. 31, 2015

(54) WIRELESS NON-CONTACT SWITCH FOR AUTOMATIC DOORS

(75) Inventors: Robert Blair, Torrance, CA (US);
James Sargent, Torrance, CA (US);
Toshiyasu Matsuyama, Torrance, CA (US)

(73) Assignee: Optex Inc., Rancho Dominguez, CA (US)

( * ) Notice: Subject to any disclaimer, the term of this patent is extended or adjusted under 35 U.S.C. 154(b) by 654 days.

(21) Appl. No.: 13/326,246

(22) Filed: Dec. 14, 2011

(65) Prior Publication Data
US 2013/0156433 A1      Jun. 20, 2013

(51) Int. Cl.
*H01H 35/00*        (2006.01)
*H04B 10/00*        (2013.01)

(52) U.S. Cl.
CPC ............... *H01H 35/00* (2013.01); *H04B 10/00* (2013.01)
USPC ......... 307/116; 318/466; 340/545.1; 398/106

(58) Field of Classification Search
CPC .............................. H01H 35/00; H04B 10/00
USPC ......... 307/116; 318/466; 398/106; 340/545.1
See application file for complete search history.

(56) References Cited

U.S. PATENT DOCUMENTS 8,169,317 B2 *  5/2012  Lemerand et al. ......... 340/545.1
2010/0253516 A1  10/2010  Lemerand et al.

* cited by examiner

*Primary Examiner* — Hal Kaplan
(74) *Attorney, Agent, or Firm* — Yokoi & Co., U.S.A.; Toshiyuki Yokoi

(57) ABSTRACT

The wireless non-contact switch detects movement of human body in the beam-shaped detection are which extends from the upper area on the wall toward the floor surface, and controls opening and closing of the automatic door. Regardless of the height of the location of the movement, as long as it is in the detection area, the switch detects the movement of different height location in the detection area. Therefore, regardless of the difference of regulation between each states, it can be operated at any height of the movement.

14 Claims, 15 Drawing Sheets

F I G . 6
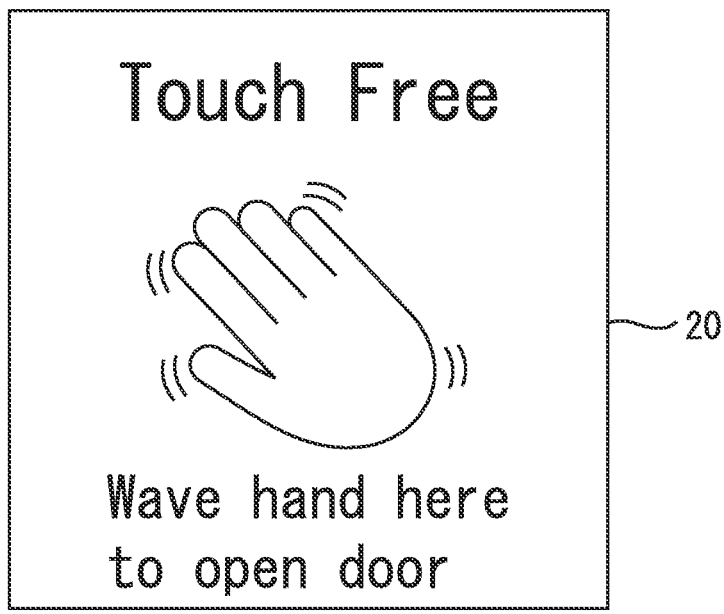

Area a

Area b

WIRELESS NON-CONTACT SWITCH FOR AUTOMATIC DOORS

BACKGROUND OF THE INVENTION

1. Field of the Invention

This invention relates to a wireless non-contact switch for automatic doors.

2. Description of the Related Art

As a conventional control system which detects human bodies by infrared and controls opening and closing of an automatic door, US Patent application publication US 20100253516A1 is known.

According to the invention disclosed in the bulletin, an infrared sensor is installed above an automatic door header and is connected to a control unit of the automatic door by wire. Then the infrared sensor detects human bodies around the automatic door.

According to the above described invention, since the infrared sensor is installed to detect human bodies in front of the automatic door, the infrared sensor is required to detect widely. Therefore it tends to detect the human bodies when the person does not intend to open the automatic door.

Further, in hospitals, a plurality of automatic door switches are required to be installed at designated heights on the wall surface. In case the switches are connected by wire, it would be difficult to change their position in order to meet the regulation concerning the heights.

BRIEF SUMMARY OF THE INVENTION

The present invention provides a wireless non-contact switch for automatic doors which can be operated by users when they actually need to operate it, and which can be changed its location easily in order to meet regulations of each states.

The present invention provides a wireless non-contact switch for automatic doors comprising a non-contact sensor which can be installed on a wall surface with a beam-shaped detection area from upper area on the wall surface toward a floor surface, and detects moving body at different heights; a transmission side control circuit which generates a detection signal corresponding to predetermined operations based on detecting result from the non-contact sensor; a plurality of pseudo-touch signs which show signs for pseudo-touching area on the wall surface at a plurality of desired heights; a wireless transmitter which transmits transmission signal wirelessly based on the detection signal from the transmission side control circuit; a wireless receiver which receive the transmission signal transmitted by the wireless transmitter and outputs receiving signal; a switch which controls opening and closing operations of the automatic door; and a receiving side control circuit which controls the opening and closing operation of the switch based on the receiving signal from the wireless receiver.

According to the present invention, the wall mounted non-contact sensor has the beam-shaped detection area which extends from upper area of the wall toward the floor surface along the wall surface, and is available to detect moving human body at a plurality of different heights.

Further, a plurality of pseudo touch signs show pseudo-touching area on the wall surface at a plurality of different heights. For example, those pseudo touch signs can be a plurality of plates which are installed at a height where users can easily access by their hands or at a height where the users can easily access by their feet. The pseudo-touch signs can be a projector which projects a plurality of light signs by emitting strong light.

Therefore, when users wave their hands near the pseudo touch sign or put their feet near the pseudo touch sign, a part of human bodies move in the beam-shaped detection area of the non-contact sensor which is installed above. Then the non-contact sensor detects the movement and outputs detecting result. For example, when the non-contact sensor is a passive infrared sensor, it detects a flicker of far-infrared rays radiated by the human bodies.

Based on the detecting result of the non-contact sensor, the transmission side control circuit generates a detection signal corresponding to the predetermined operation which is a movement of the detected human body, and the wireless transmitter transmits a transmission signal based on the detection signal from the transmission side control circuit wirelessly.

On the other hand, when the wireless receiver receives the transmission signal transmitted by the wireless transmitter, the wireless receiver outputs the receiving signal. And the switch controls the opening and closing of the automatic door based on the receiving signal from the wireless receiver.

The wireless transmitter and the wireless receiver can communicate with each other by, for example, radio or light signal communication.

Therefore, according to the present invention, the opening and closing of the automatic door can be controlled by the movement in the beam-shaped detection areas which extends from the upper area of the wall surface toward the floor surface.

In addition, the movement can be detected in the detection area regardless of heights of the location, as long as the movement locates in the beam-shaped detection area, both of an operation at high position and at low positions can be equally detected. Therefore, regardless of the different regulation of each states concerning the installment positions in height, the automatic door can be operated by an operation at any heights.

Although the pseudo touch plates inherently do not have any duties other than telling manipulators about operation, the pseudo touch signs show mentally the opening and closing operation should be done at the position in the height where the signs are shown on the wall surface to the manipulators.

Of course, the pseudo touch plates can be installed at the position in the heights which are regulated by each state's regulation.

BRIEF DESCRIPTION OF THE DRAWINGS

FIG. 6 is a front elevation of the pseudo touch plate.

DETAILED DESCRIPTION OF THE INVENTION

Figure 1:
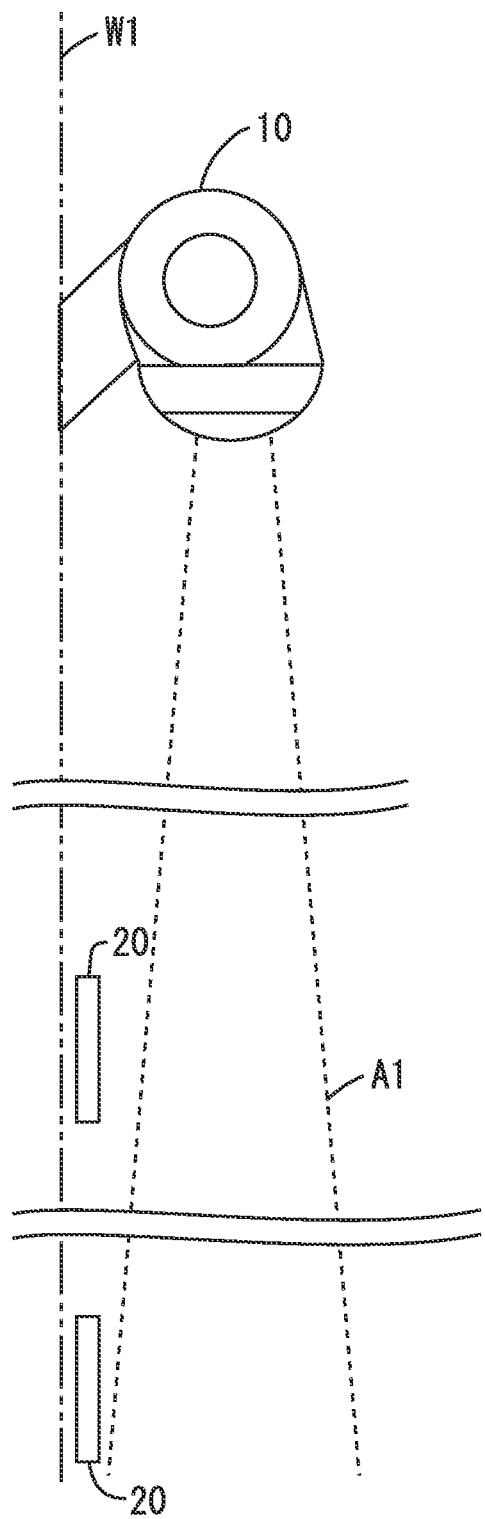
FIG. 1 is a side view of the wireless non-contact switch for automatic doors.
Figure 2:
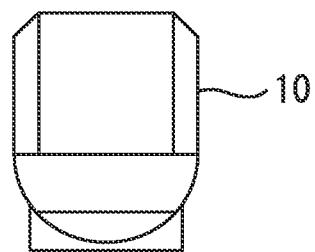
FIG. 2 is a front elevation of the wireless non-contact switch for automatic doors.
Figure 2:
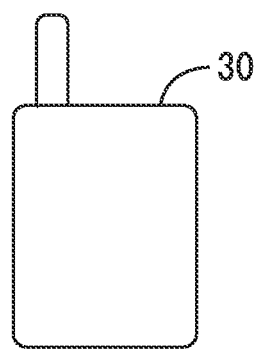
Figure 3:
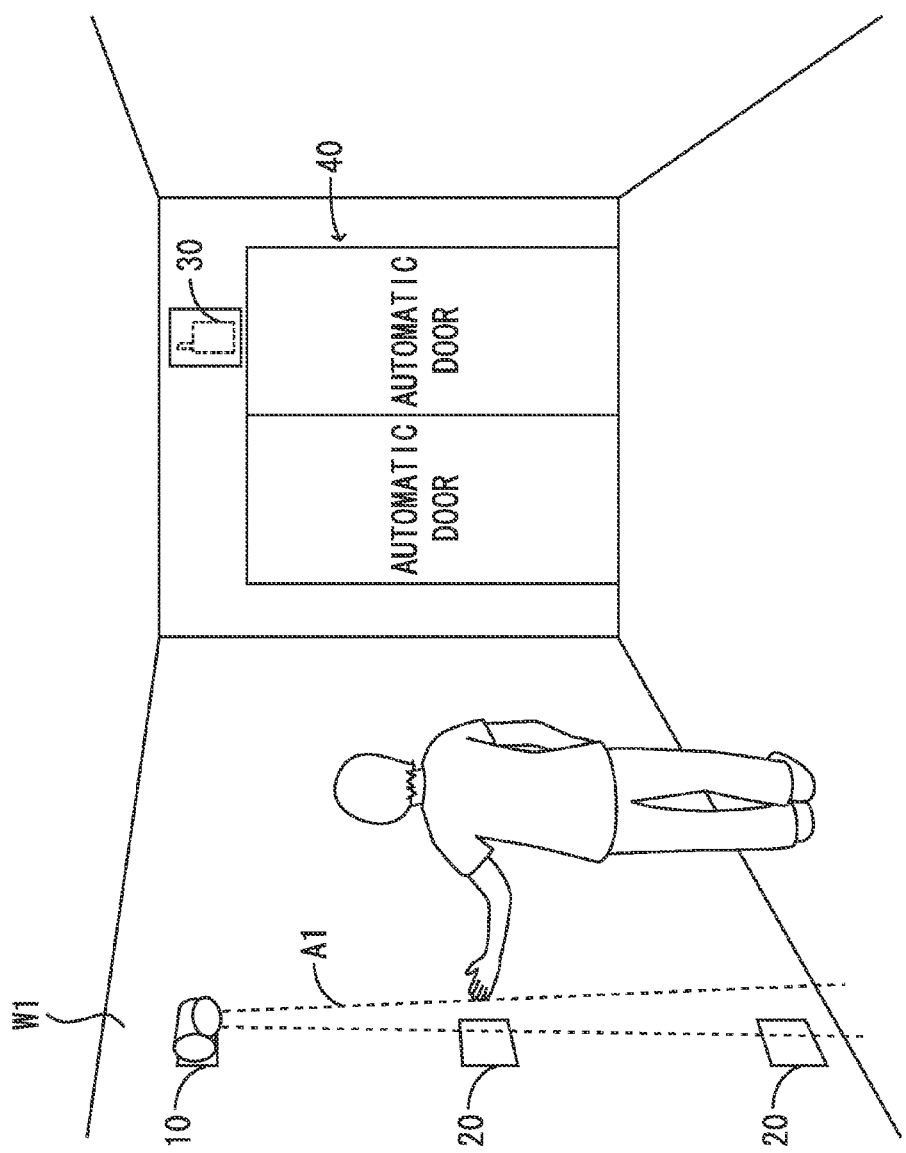
FIG. 3 is a figure showing a setting state of the wireless non-contact switch for automatic doors.

An embodiment of the present invention will be explained hereinafter referring drawings. FIG. 1 shows the embodiment by the side view, and FIG. 2 shows it by the front elevation. In addition, FIG. 3 shows the embodiment by the setting state view.

A transmission side unit 10 is installed in the upper area of a wall surface W1. The transmission side unit 10 has beam-shaped detection area A1 which extends toward a floor surface. The shape of the beam-shaped detection area A1 may be column-like shape or cone-like shape. However, it is not limited to a certain shape if it can narrow actual detection area. Further the beam-shaped detection area can be virtually achieved by an image sensor and an image analyzing circuit. The image sensor record an image around the pseudo touch sings from upper area and outputs image data of the image. And the image analyzing circuit analyzes the image data output by the image sensor and detects the moving body in the detection area from the image data.

In the present embodiment, the pseudo touch area signs are carried out by pseudo touch plates 20,20 which are installed on the wall surface W1 in order to show the detection area Al at a plurality of positions of different heights.

A receiving side unit 30 corresponding to the transmission side unit 10 is installed in neighborhood of an automatic door 40. Since most of the automatic doors 40 are equipped with a header above doors, the receiving side unit 30 can be installed in such header.

The transmission side unit 10 is battery driven, and it communicates with the receiving side unit 30 by radio. The receiving side unit 30 is connected to the automatic door 40 with cables, and controls opening and closing of the automatic door 40. Further, a pair of the transmission side unit 10 and the receiving side unit 30 can be installed separately with the automatic door 40. Namely, where the automatic door 40 which is controlled by a wired switch is already installed, the pair of the transmission side unit 10 and the receiving side unit 30 can be installed later. In this embodiment, the transmission side unit 10 and the receiving side unit 30 communicates with each other by radio. However, they can communicate with each other by other wireless system such as light signal communication. Further another system such as supersonic communication system can be also adoptable.

The pseudo touch plates 20,20 are installed at the heights which each states prescribe in their regulations. They are generally located at heights suitable for operating by hand or by foot.

Figure 4:
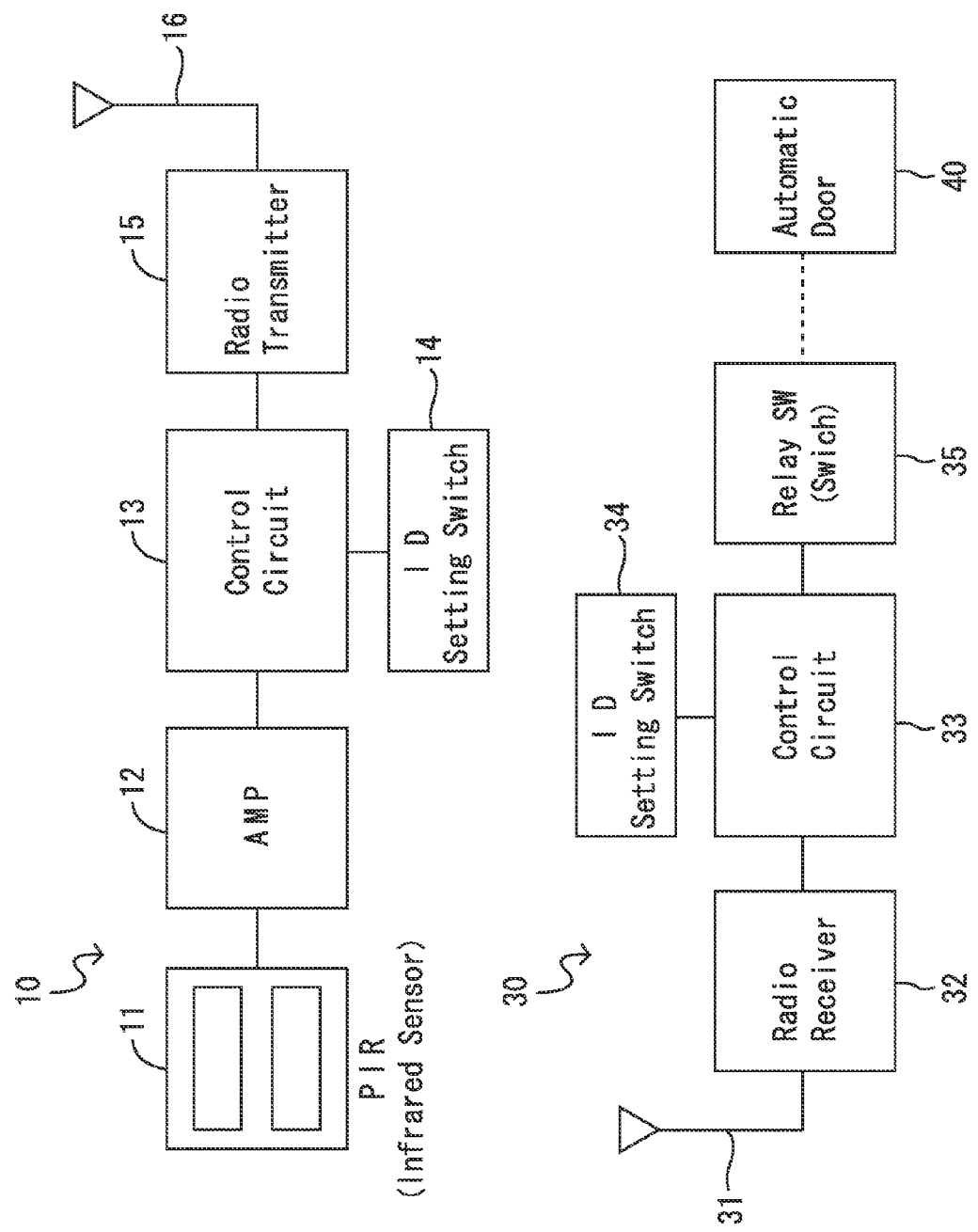
FIG. 4 is block diagram of the wireless non-contact switch for automatic doors.

FIG. 4 shows the wireless non-contact switch for automatic doors by the block diagram.

A transmission side unit 10 comprises an infrared sensor 11, an amplifier 12 which amplifies output signal of the infrared sensor 11, a transmission side control circuit 13 which generates detection signal based on detecting result from the infrared sensor 11, an ID setting switch 14 which sets a cord for identification purpose to each transmission side unit 10, a radio transmitter 15 which transmits transmission signal from an antenna 16 by radio based on the detection signal of the transmission side control circuit 13. And, as mentioned above, the infrared sensor 11, the ID setting switch 14, the radio transmitter 15 and the antenna 16 which correspond to the non-contact sensor, the transmission side control circuit and the wireless transmitter are battery driven A receiving side unit 30 comprises a radio receiver 32 which receives the transmission signal from the radio transmitter 15 through an antenna 31 and outputs receiving signal, a receiving side control circuit 33 which generates control signal corresponding to the above transmission signal based on the receiving signal, an ID setting switch 34 which sets a cord for identification propose to each receiving unit 30, and a switch 35 which is connected to the automatic door 40 and is controlled its opening and closing of contacts by the receiving side control circuit 33.

The infrared sensor 11 is a passive infrared sensor. Since the transmission side unit 10 is driven by a battery, the infrared sensor of the passive type is adopted so that consecutive long term driving becomes possible. However, the non-contact sensor is not limited to the passive infrared sensor. For example, an active infrared sensor can be also adopted if the battery issue is cleared. Further, recently a micro-wave sensor is adopted as such a non-contact sensor.

The infrared sensor 11 is equipped with an optical system which is not illustrated, and has beam-shaped detection area A1 by the optical system which extends from upper part of the wall surface toward the floor surface. Since the infrared sensor 11 has an area for detection rather than a physical knob of a switch, it can detect an operation which is not done at an exact location. Therefore it is convenient for those who cannot operate his body accurately, and will be fit to be installed hospitals. Further, in food processing factory, where germ free is required, such non-contact detecting method for operating the automatic door will fit very well.

Figure 5:
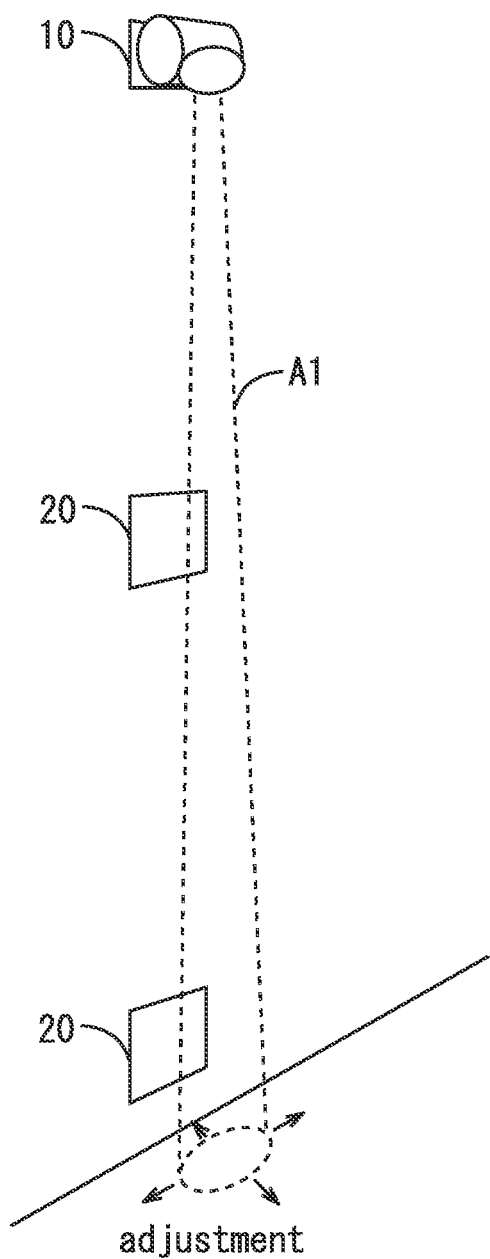
FIG. 5 is a figure showing adjustable range of the detection area of the infrared sensor.

In addition, the infrared sensor 11 and the optical system is capable of fine adjustment. FIG. 5 shows adjustable range of the detection area A1 of the infrared sensor 11. As the first fine adjustment, the detection area A1 can be moved to be closer or far away to the wall surface as shown in the FIG. 5.

In addition, as the second fine adjustment, the detection area A1 can be moved along the wall surface as shown in the FIG. 5. Further, the detection area A1 can be rotated as fine adjustment in case the non-contact sensor has directivity in sensing capacity.

By the way, when a user shades the detection area A1 by waving his hand while walking down aisle toward the automatic door, the hand actually passed through the detection area A1 very fast. The inventor found the required maximum sensitivity to cope with the speed should be at least 1 m/sec. Namely, the non-contact sensor must be capable of detecting human boy at a speed of 1 m/sec.

The transmission side control circuit 13 generates predetermined detection signal based on output signal of the infrared sensor 11 which is input to through the amplifier 12.

The ID setting switch 14 sets a cord for identification purpose to the control circuit 13 beforehand. The code is set for each transmission side unit 10 in order to be able to use a plural pair of the transmission side unit 10 and the receiving side unit 30 at the same time.

In this embodiment, the cord of the transmission side control circuit 13 can be set by user. However, the unique cord may be set to each transmission side control circuit 13. In this case, the receiving side control circuit 33 must learn the cord of the corresponding transmission side control circuit 13 beforehand. Usually such learning process can be done by pairing technique.

The control circuit 13 adds the code which the ID setting switch 14 set to the detection result of the infrared sensor 11 and generates the detection signal. Of course, the same code has to be set by the ID setting switch 34 to the receiving side unit 30. The code is an ID. And the radio transmitter 15 transmits transmission signal based on the detection signal of the transmission side control circuit 13 through the antenna 16. Thus the detection result of the infrared sensor 11 is transmitted by radio. Of course, there is not any particular limitation concerning frequency and/or encoding method of the transmission signal. Any frequency and/or encoding method can be adopted which are acceptable at the setting location according to regulation.

Figure 7:
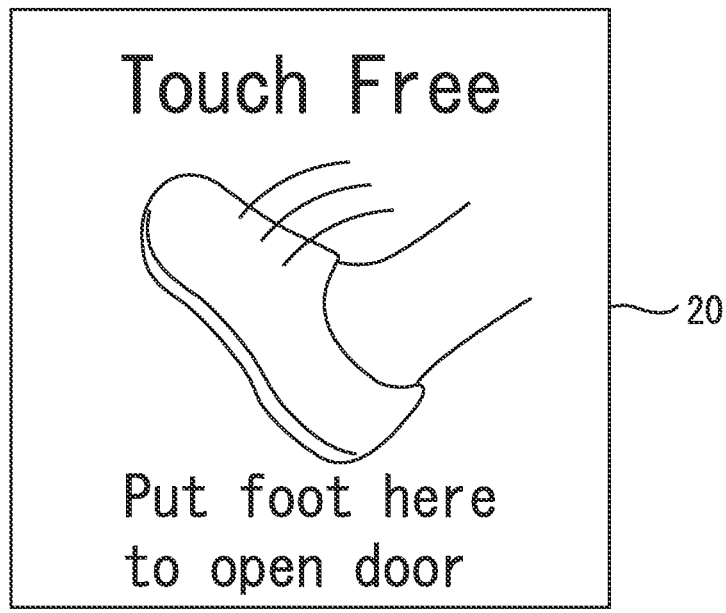
FIG. 7 is a front elevation of the pseudo touch plate.

FIG. 6 and FIG. 7 show an example of indication on the pseudo touch plates 20,20. FIG. 6 shows the pseudo touch plate 20 which is installed at higher location. Namely it shows an indication to induce waving action by hand without touching the pseudo tough plate 20. Therefore, it mainly promotes an operation to move a hand in parallel with the wall surface. On the other hand, FIG. 7 shows the pseudo touch plate 20 which is installed at lower location. Namely it shows an indication to induce putting action of a foot in front of the pseudo touch plate 20 without touching it. In other word, an action to bring the foot closer to and to pull the foot from the pseudo touch plate 20. Therefore, it mainly promotes an operation to stop by near the pseudo touch plate 20 and to bring his or her foot slowly to the pseudo touch plate 20.

Figure 8:
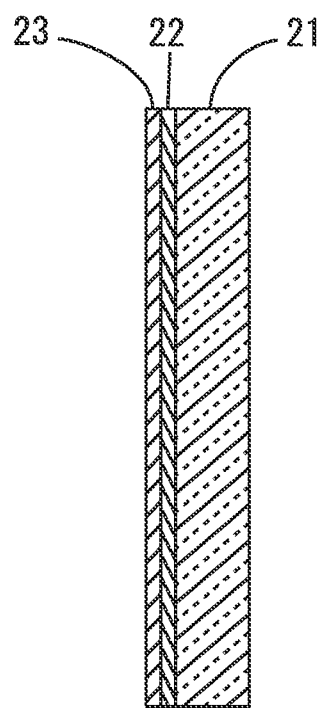
FIG. 8 is a side cross section of the pseudo touch plate.

FIG. 8 shows pseudo touch plate 20 by side view. It is technically not necessary to actually touch the pseudo touch plate 20 for detection of the operation. However, there are many users who actually are going to touch the pseudo touch plates 20,20 when they see them due to psychological effect. Therefore, if the automatic doors are operated very often, printing on the front surface of the pseudo touch plates 20,20 will be wiped off very soon.

On this account, in the pseudo touch plate 20 of the present embodiment, a translucent resin plate 21 which is provided with a printed layer 22 on which an operating instruction is printed on the wall surface side, a back side, is equipped with an adhesion member 23 such as double-stick tape on the surface of the printed layer 22. Thus the printed layer 22 will not be disappeared while the translucent resin of the 21 is not completely worn down.

The radio receiver 32 has common specifications such as radio frequencies with the radio transmitter 15, and outputs receiving signal when it receives the transmission signal from the radio transmitter 15. The receiving side control circuit 33 recognizes an ID contained in the receiving signal from the radio receiver 32, and judges whether it matches with the ID set by the ID setting switch 34. And when they match each other, the receiving side control circuit 33 controls opening and closing of the switch 35 in correspondence with the detection result expressed by the receiving signal. Since the opening and closing of the automatic door 40 is controlled by the contact of the switch 35, due to the opening and closing of the switch 35, the automatic door 40 will be opened or closed.

Figure 9:
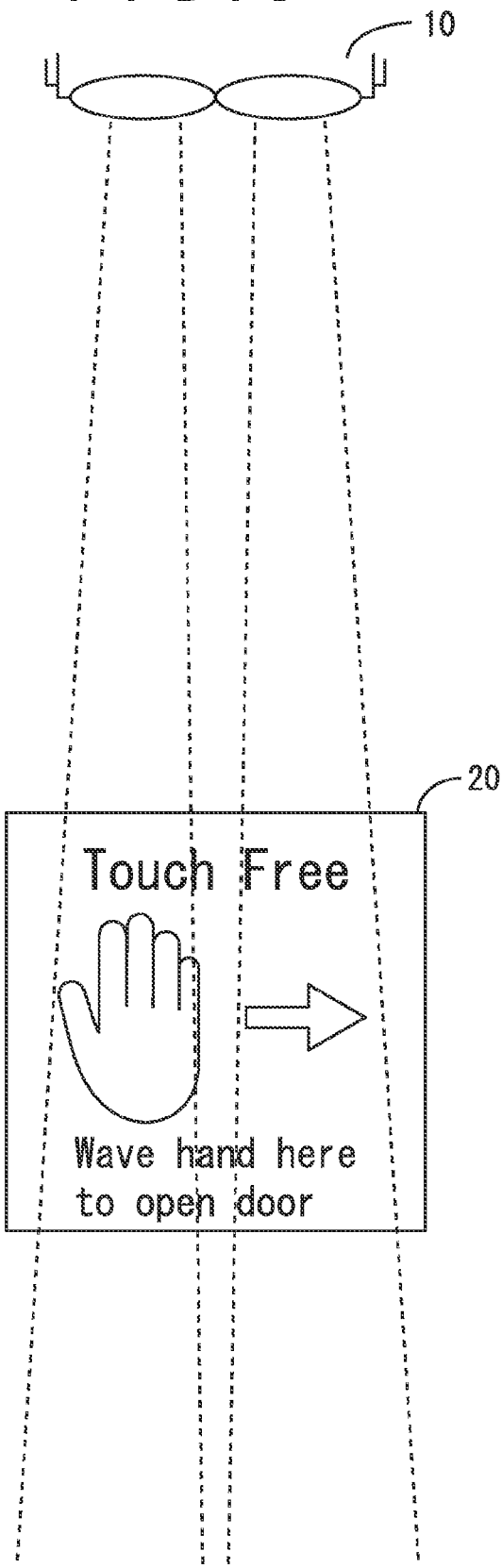
FIG. 9 is a figure showing an installed state of the wireless non-contact switch for automatic doors of another embodiment.

FIG. 9 shows another embodiment of the present invention. In the embodiment, two infrared sensors 11,11 are allocated in parallel with the floor surface. Then two detection areas A1,A1 are generated, and users performs an operation to pass the two detection areas A1,A1 by their hand sequentially. Thus a transmission side control circuit in the embodiment can detects whether the users are approaching toward the automatic doors or not by the detection signal which are output in sequentially from the two infrared sensors 11,11.

Namely, it can detects direction of the movement which passes through the detection areas, and the transmission side control circuit generates detection signal depending on the direction. In other words, in case of the approaching operation, it controls the automatic door to open. Otherwise, it ignores the detection signal as false detection. Namely, when the transmission side control circuit detects the user is approaching toward the automatic doors, it controls to open the automatic door. However, when the transmission side control circuit detects the user is not approaching toward the automatic doors, it does not control to open the automatic door even though detection signal are actually received from the infrared sensors 11. Thus it will be possible to prevent unintentional opening and closing of the automatic doors.

Figure 10:
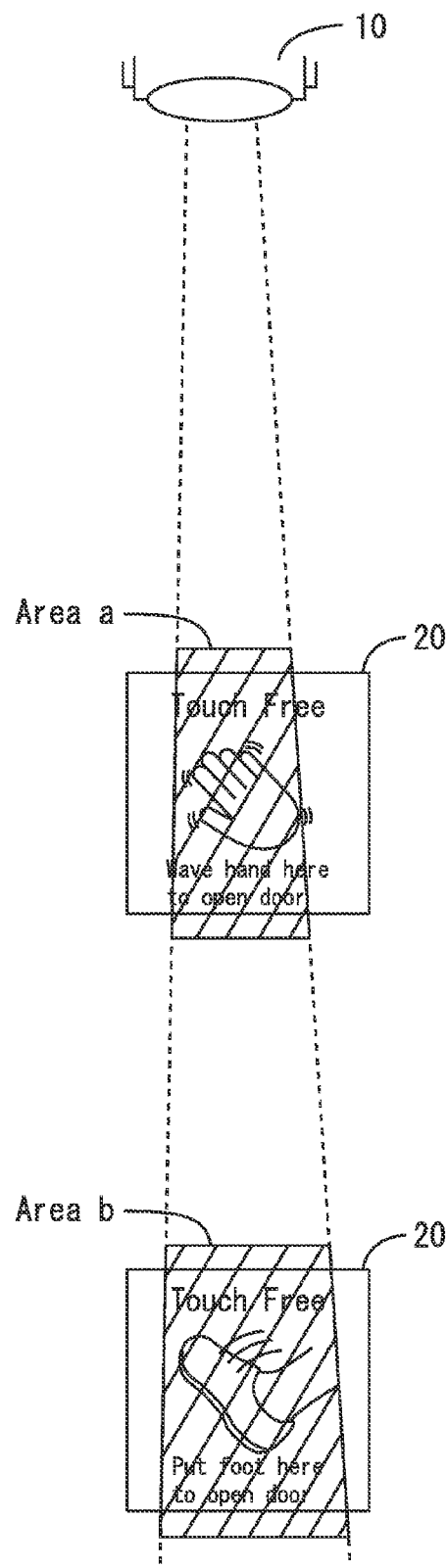
FIG. 10 is a figure showing an installed state of the wireless non-contact switch for automatic doors of another embodiment.

FIG. 10 shows another embodiment of the present invention. In the embodiment, the non-contact sensor is capable of the distance to the moving body. In order to detect the distance, triangulation method and time-of-flight method are well-known. An active infrared sensor outputs detecting infrared light and receive reflecting infrared light from a target. Thus the time difference between outputting and receiving time can be used to detect the distance. The time-of-flight method measure such time difference and detects the distance. Further, in case two such active infrared sensors are allocated in distance, the information of the location of each sensors and measured distance from each sensors could be used to locate the target by the triangulation.

In case the distance is measured by the non-contact sensor, the automatic door 40 can be controlled separately according to the distance. For example, those who wave hands to operate the automatic door 40 are supposed to be able to walk normally. Thus it would not be necessary to operate the automatic door 40 with special consideration. On the contrary, those who used their foot to operate the automatic door 40 are supposed to have some disability in walking. Thus it would be necessary to operate the automatic door with special consideration. Thus the automatic door 40 may be kept open longer than when it is operated by hands. Such different operation can be achieved by the transmission side control circuit 13 and the receiving side control circuit 33.

Namely, when the transmission side control circuit 13 detects the operation is made in "Area a" which locates at higher position than "Area b", the transmission side control circuit 13 include such information in the signal. And when the receiving side control circuit 33 detects the distance from the signal, it controls the automatic door 40 as usual. On the contrary, when the transmission side control circuit 13 detects the operation is made in "Area b" which locates at lower position than "Area a", the transmission side control circuit 13 include such information in the signal in order to let the receiving side know the operation was made by foot. Then the receiving side control circuit 33 detects the distance from the signal, and controls the automatic door 40 to open and close more slowly.

Figure 11:
FIG. 11 is a figure showing an output signal of the transmission side control circuit.
Figure 12:
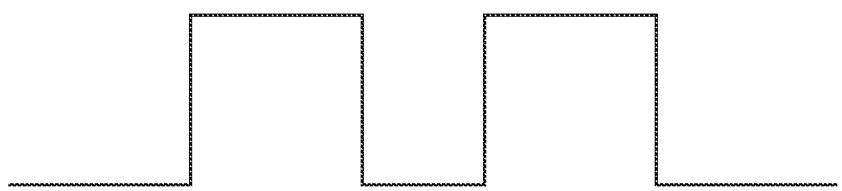
FIG. 12 is a figure showing an output signal of the transmission side control circuit.

Further, when the transmission side control circuit 13 includes the distance information in the signal, it is not necessary to include actual distance. Namely, since there is only two distances to be measured, the information may be two, namely short or long. In order to send such two information, the FIG. 11 shows an example for the "Area a," and the FIG. 12 shows an example for the "Area b." Namely, the longer pulse signal means "Area a," and the shorter two pulse signals means "Area b."

Figure 13:
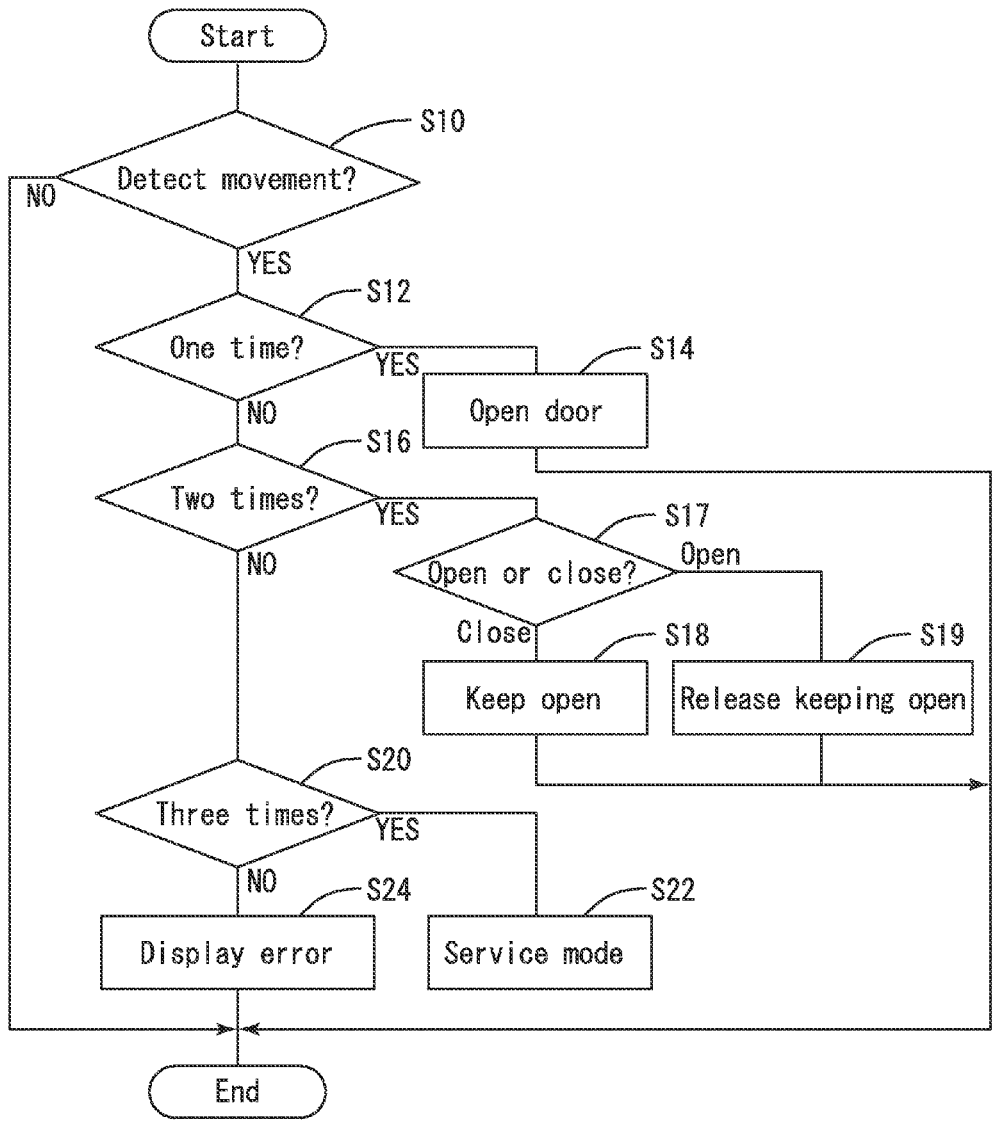
FIG. 13 is flow chart of another embodiment.

Further, FIG. 13 shows another embodiment of the present invention. In the embodiment, using one infrared sensor 11, the controlling operation will be changed depending on number of detections of the human body in a predetermined period.

Figure 14:
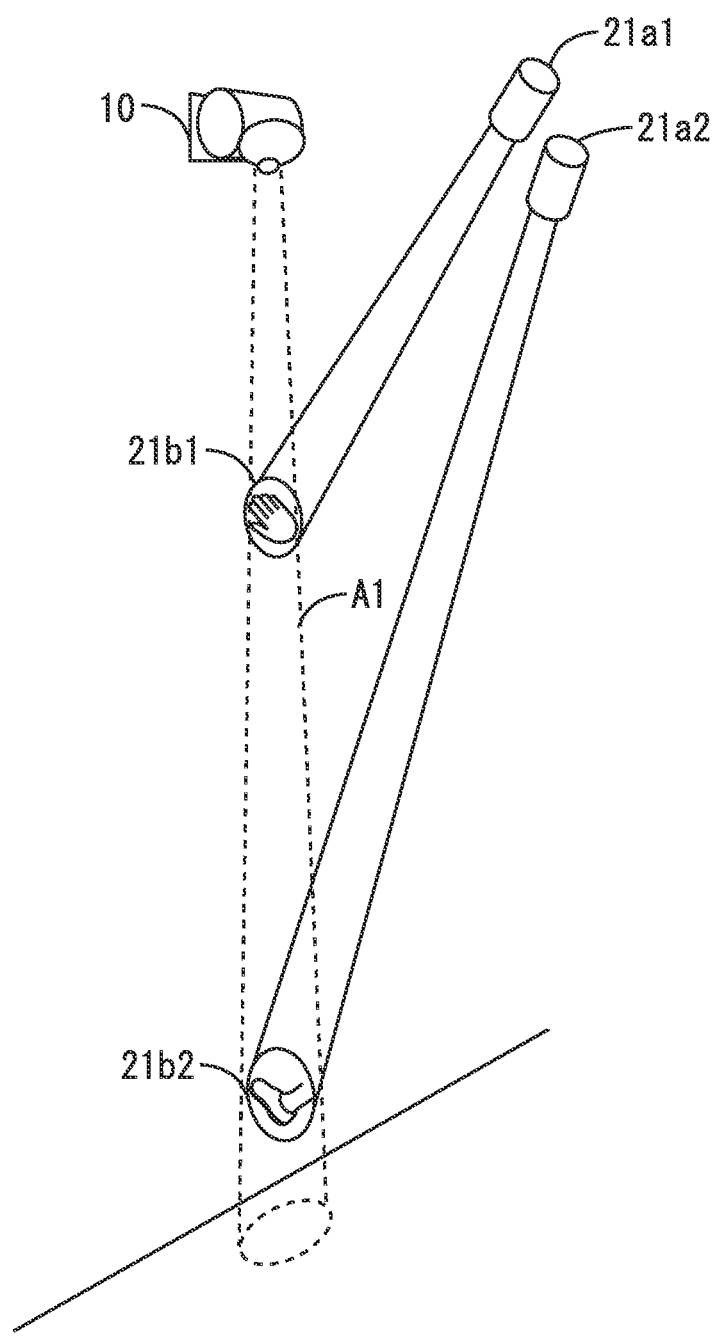
FIG. 14 is a figure showing pseudo touch area signs of another embodiment.

In the transmission side control circuit, a CPU which is capable of carrying out a program corresponding to the flow chart shown in FIG. 14 and other peripheral devices are equipped. In addition, it is available to detect the operation of the infrared sensor and number of detections. Such detection and counting can be realized by subroutines which are carried out separately from main routine.

In step S10 of the program, it judges whether the infrared sensor 11 detected movement or not, and if the movement is not detected, it finishes the program. However, in case the movement is detected in step S12, it judges whether the movement is once or not. When the number of the movement is judged to be once in step S14, it generates detection signal to open an automatic door.

However, in case the number of the movement is judged to be twice in step S16, it generates the detection signal which holds the automatic door to be open in step S18. In this case, if the door is already open, the operation means to release keeping open. Therefore, when the number of the movement is judged to be twice in step S16, then the status of the door is judged to be open or close in step S17, and when it is close, in step S18 the door should be kept open. On the contrary, when it is open, in step S19 the door should be closed.

And in case the number of the movement is judged to be three times in step S20, it enters into the service mode in step S22. In the service mode, it becomes possible to carry out input and output in detail by servicemen.

Further, in case the number of the movement is not one of the 1 to 3 times, it displays an error in step S24. Since the indication of the error is not necessary and is equivalent to doing substantially nothing, it may be enough merely to turn on a LED for error indication or equivalent display.

And, in the receiving side control circuit, it controls the opening and closing of the switch which is connected to an automatic door depending on these instructions, and the automatic door will be actually operated according to the instructions.

Namely, the transmission side control circuit generates the detection signals corresponding to attitudes of the operation which passes through the detection area, and the receiving side control circuit controls opening and closing of the switch according to the attitudes of the operation. More concretely, number of operations which pass through the detection area within a predetermined period is used as the attitudes of the operation, and the automatic door is actually controlled by the number of the detected operations.

As mentioned above, in case only one infrared sensor is used, it becomes possible to give instructions of a plurality of operations.

In the above mentioned embodiment, the pseudo touch area signs are achieved by a plurality of plates. However, the pseudo touch area signs are not limited to those plates. For example, the pseudo touch area signs can be achieved by projecting light signs on the wall as illustrated in FIG. 14. As shown in the figure, two spot lights 21a1,21a2 which project light signs 21b1,21b2 on the wall W1 are installed on a sealing (not shown in the figure). The spot lights 21a1,21a2 can be achieved by any projectors which emit relatively strong light to project light signs 21b1,21b2 which are visible under ordinarily bright circumstance. Further a laser projector can be used in place of the spot lights 21a1,21a2. In this case, the pseudo touch plates 20,20 are not required. And it will be very easy to change the position of the light signs by adjusting tilting degree of the spot lights since physical signs are not used.

Figure 15:
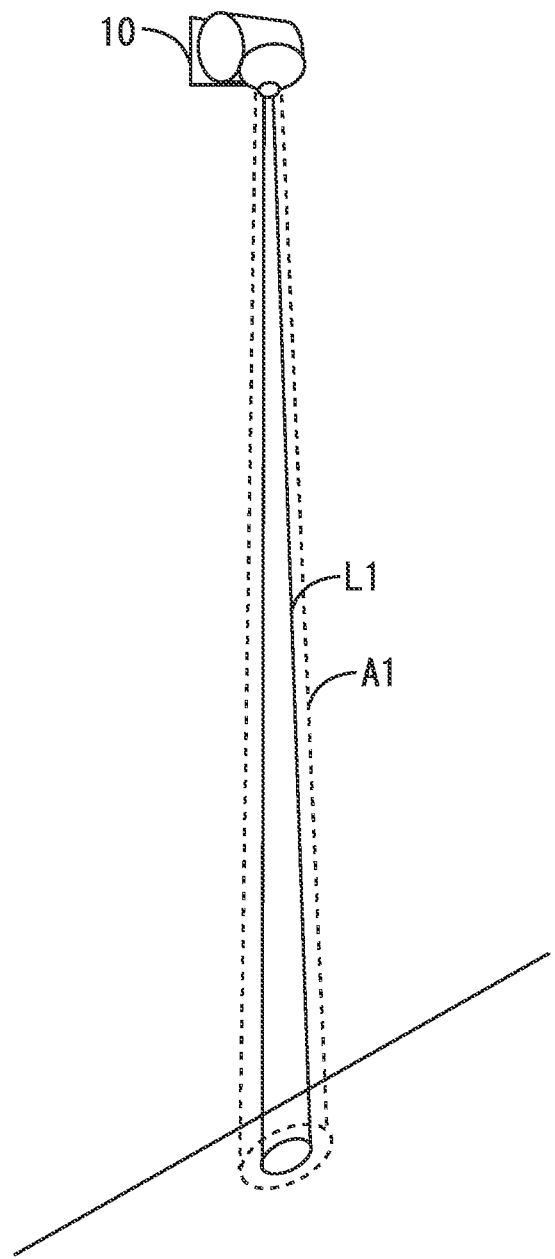
FIG. 15 is a figure showing pseudo touch area signs of another embodiment.

Further, as another embodiment in FIG. 15, the pseudo touch area sign can be almost same with the beam-shaped detection area. In the embodiment, a light element (not shown) is installed in the transmission side unit 10 and emits a beam-shaped light toward the floor surface. Since the light element itself is installed in the transmission side unit 10, when the light element emits the beam-shaped light downward, the light beam shows a long continuous beam-shaped light column L1 toward the floor. The light column L1 itself expresses a beam-shaped detection area A1. And users will understand where she or he should wave hands or put foot. As the light element in this embodiment, a laser element can be used.

Figure 16:
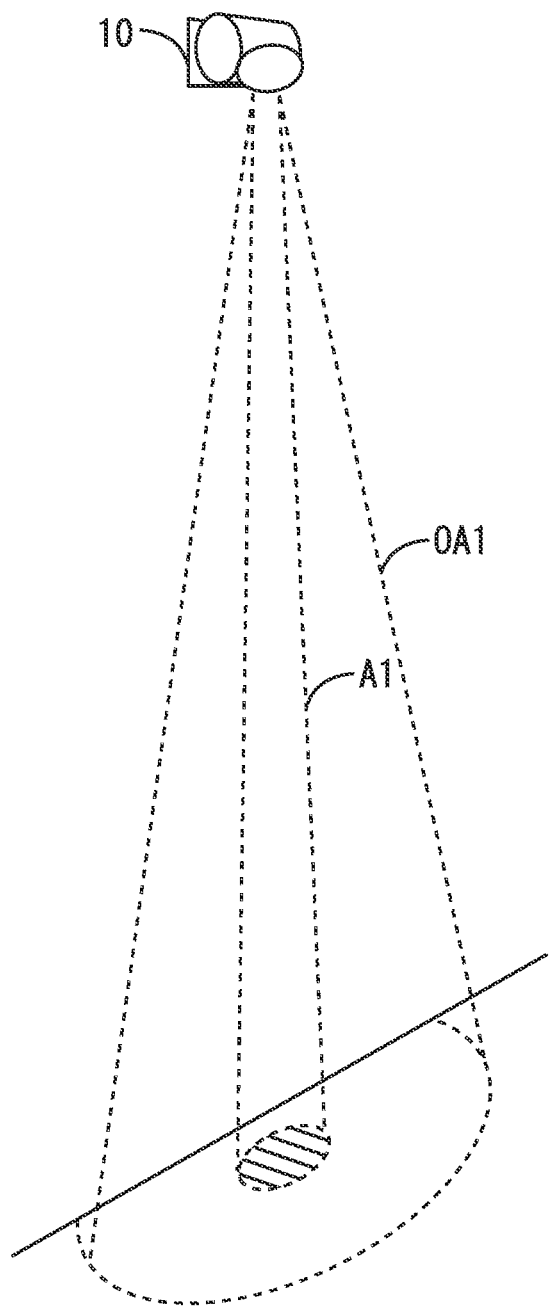
FIG. 16 is a figure showing a non-contact sensor of another embodiment.

The non-contact sensor may have not only the beam-shaped detection area but also an outer detection area OA1 around the beam-shaped detection area A1 as shown in FIG. 16. It will be more useful if wrong detections are reduced. In this embodiment, when users move their hands or put their foot in the beam-shaped detection area, their body should also be around the beam-shaped detection area. Therefore if the non-contact sensor does not detect human body in the outer detection area OA1, but detects human body in the beam-shaped detection area A1, it is highly possible the detecting result in the beam-shaped detection is caused by error. On the contrary, if the non-contact sensor detects human body in the beam-shaped detection area A1 and in the outer detection area OA1, it is highly possible that the detecting result is true, since it is rarely possible that wrong detection in the beam-shaped detection area A1 and wrong detection in the outer detection area OA1 occurs simultaneously. Therefore by adapting such outer detection area OA1, it becomes possible that non-contact sensor output detecting result only when the non-contact sensor detects human body in both of the beam-shaped detection area A1 and the outer detection area OA1. And it causes the wrong detection as least as possible.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed is:

1. A wireless non-contact switch for automatic doors comprising
    a non-contact sensor which can be installed on a wall surface with a beam-shaped detection area from an upper area on the wall surface toward a floor surface, and detects a moving body at different heights,
    a transmission side control circuit which generates a detection signal corresponding to predetermined operations based on a detecting result from the non-contact sensor,
    a plurality of pseudo-touch area signs which show signs for pseudo-touching areas on the wall surface at a plurality of desired heights,
    a wireless transmitter which transmits transmission signal wirelessly based on the detection signal from the transmission side control circuit,
    a wireless receiver which receives the transmission signal transmitted by the wireless transmitter and outputs a receiving signal,
    a switch which controls opening and closing operations of the automatic door, and a receiving side control circuit which controls an opening and closing of the switch based on the receiving signal from the wireless receiver.

2. The wireless non-contact switch for automatic doors of claim 1, wherein
the non-contact sensor comprises one of a passive infrared sensor, an active infrared sensor and a micro-wave sensor.

3. The wireless non-contact switch for automatic doors of claim 2, wherein
the wireless transmitter comprises a radio transmitter, and the wireless receiver comprises a radio receiver.

4. The wireless non-contact switch for automatic doors of claim 2, wherein
the non-contact sensor is capable of being adjusted to move the beam-shaped detection area.

5. The wireless non-contact switch for automatic doors of claim 1, wherein
the non-contact sensor, the transmission side control circuit and the wireless transmitter are battery driven.

6. The wireless non-contact switch for automatic doors of claim 1, wherein
the non-contact sensor is capable of detecting direction of an operation which passes through the detection area, and
the transmission side control circuit generates different detection signals according to the detected direction.

7. The wireless non-contact switch for automatic doors of claim 1, wherein
the transmission side control circuit generates the detection signals corresponding to a number of operations which pass through the detection area within a predetermined period, and
the receiving side control circuit controls opening and closing of the switch according to the number of the operations which pass through the detection area.

8. The wireless non-contact switch for automatic doors of claim 7, wherein
the receiving side control circuit controls the opening and closing of the switch to keep the automatic door open.

9. The wireless non-contact switch for automatic doors of claim 1, wherein
the non-contact sensor has an outer detection area around the beam-shaped detection area and detects the moving body when the moving body is detected in the beam-shaped detection area and in the outer detection area.

10. The wireless non-contact switch for automatic doors of claim 1, wherein
the non-contact sensor is capable of detecting a distance of the moving body from the non-contact sensor and generating detection signals corresponding to the distance, and
the receiving side control circuit controls opening and closing of the switch according to the distance.

11. The wireless non-contact switch for automatic doors of claim 10, wherein
two non-contact sensors are allocated in distance, and
the non-contact sensors use a triangulation method to detect the distance.

12. The wireless non-contact switch for automatic doors of claim 10, wherein
the non-contact sensor uses a time-of-flight method to detect the distance.

13. The wireless non-contact switch for automatic doors of claim 1, wherein
the non-contact sensor comprises an image sensor and an image analyzing circuit which detects the moving body in the detection area from image data output by the image sensor.

14. The wireless non-contact switch for automatic doors of claim 1, wherein
the pseudo-touch area signs comprise a plurality of plates which can be installed on the wall surface.

* * * * *